United States Patent
Cummings et al.

(10) Patent No.: US 9,591,496 B2
(45) Date of Patent: *Mar. 7, 2017

(54) INTEGRATED CIRCUIT DESIGN AND OPERATION USING AGENTS ASSOCIATED WITH PROCESSING CORES TO NEGOTIATE MUTUALLY COMPATIBLE PARAMETERS TO ACHIEVE AN APPLICATION-RELATED OBJECTIVE

(71) Applicant: Mark Cummings, Atherton, CA (US)

(72) Inventors: Mark Cummings, Atherton, CA (US); Takehito Sasaki, Sunnyvale, CA (US)

(73) Assignee: Mark Cummings, Atherton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/993,641

(22) Filed: Jan. 12, 2016

(65) Prior Publication Data

US 2016/0196364 A1 Jul. 7, 2016

Related U.S. Application Data

(63) Continuation of application No. 13/290,760, filed on Nov. 7, 2011, now Pat. No. 9,268,578.
(Continued)

(51) Int. Cl.
  *G06F 9/00* (2006.01)
  *G06F 9/24* (2006.01)
  (Continued)

(52) U.S. Cl.
  CPC .......... *H04W 24/02* (2013.01); *G06F 9/4411* (2013.01); *G06F 17/505* (2013.01); *H04W 8/22* (2013.01);
  (Continued)

(58) Field of Classification Search
  CPC ...... G06F 17/505; G06F 9/4411; H04W 8/22; H04W 24/00
  (Continued)

(56) References Cited

U.S. PATENT DOCUMENTS 5,751,909 A 5/1998 Gower
5,970,490 A 10/1999 Morgenstern
(Continued)

FOREIGN PATENT DOCUMENTS

CN 101013957 8/2007

OTHER PUBLICATIONS

Visarius, et al. "Generic Integration infrastrucute for IP-based design processes and tools with a unified XML format", In Integration, the VLSI Journal—Special issue: IP and design reuse, vol. 37, issue 4. Published Sep. 2004 [online] Retrieved from the Internet <URL:http://www.sciencedirect.com/science/article/pii/S016792600400033>.*

*Primary Examiner* — Robert Cassity
(74) *Attorney, Agent, or Firm* — Van Pelt, Yi & James LLP

(57) ABSTRACT

Integrated circuit design and operation techniques are disclosed. In some embodiments, a data store stores, for each of a plurality of cores, a core image data comprising metadata about or otherwise associated with the core. A processor receives an indication of an application-related objective and uses core image data stored in the data store to identify programmatically a set of two or more cores from among the plurality of cores to help achieve the objective and to configure the two or more cores to help achieve the objective.

20 Claims, 12 Drawing Sheets

Related U.S. Application Data

(60) Provisional application No. 61/456,385, filed on Nov. 5, 2010.

(51) Int. Cl.
  *G06F 15/177* (2006.01)
  *H04W 24/02* (2009.01)
  *G06F 9/44* (2006.01)
  *H04W 8/22* (2009.01)
  *G06F 17/50* (2006.01)
  *H04W 28/02* (2009.01)
  *H04W 48/16* (2009.01)
  *H04W 24/00* (2009.01)

(52) U.S. Cl.
  CPC ....... *H04W 28/0215* (2013.01); *H04W 48/16* (2013.01); *H04W 24/00* (2013.01)

(58) Field of Classification Search
  USPC .......................................................... 713/1
  See application file for complete search history.

(56) References Cited

U.S. PATENT DOCUMENTS

| | | |
|---|---|---|
| 6,438,594 B1 | 8/2002 | Bowman-Amuah |
| 6,618,805 B1* | 9/2003 | Kampe ............... G06F 11/1433 713/1 |
| 8,775,218 B2 | 7/2014 | Burgoon, Jr. et al. |
| 2004/0111590 A1* | 6/2004 | Klein, Jr. ............ G06F 9/30181 712/226 |
| 2005/0203892 A1 | 9/2005 | Wesley et al. |
| 2007/0283317 A1 | 12/2007 | Sadler et al. |
| 2008/0046292 A1 | 2/2008 | Myers et al. |
| 2009/0070728 A1* | 3/2009 | Solomon ............. G06F 17/5045 716/128 |
| 2009/0080408 A1 | 3/2009 | Natoli et al. |
| 2011/0153854 A1 | 6/2011 | Chickering |
| 2012/0096525 A1 | 4/2012 | Bolgert et al. |

\* cited by examiner

INTEGRATED CIRCUIT DESIGN AND OPERATION USING AGENTS ASSOCIATED WITH PROCESSING CORES TO NEGOTIATE MUTUALLY COMPATIBLE PARAMETERS TO ACHIEVE AN APPLICATION-RELATED OBJECTIVE

CROSS REFERENCE TO OTHER APPLICATIONS

This application is a continuation of co-pending U.S. patent application Ser. No. 13/290,760, entitled INTEGRATED CIRCUIT DESIGN AND OPERATION FOR DETERMINING A MUTUALLY COMPATIBLE SET OF CONFIGURATION FOR CORES USING AGENTS ASSOCIATED WITH EACH CORE TO ACHIEVE AN APPLICATION-RELATED OBJECTIVE filed Nov. 7, 2011 which is incorporated herein by reference for all purposes, which claims priority to U.S. Provisional Application No. 61/456,385, entitled COLLABORATIVE COMMUNICATIONS AND COMPUTING filed Nov. 5, 2010 which is incorporated herein by reference for all purposes.

BACKGROUND OF THE INVENTION

Designers/developers of integrated circuits variously referred to as ASIC's (Application Specific Integrated Circuits) or SoC's (System on a Chip) are faced with a problem. The current technology for design and development can handle either complexity or scale but not both. There are also further problems in developing product for enlarged markets.

SoC's are designed to meet the needs of specific applications or a range of specific applications. They have advantages over general purpose processors used for those applications. The advantages generally involve cost, size, power consumption and processing suited to the application. In some cases SoC's are the only way to fully meet application requirements.

In many cases, an SoC has been developed as the least common multiply of IPs in order to cover as many applications as possible. That has been considered as the solution for shorter time to market and less development cost. For example, an SoC with SATA, Ethernet, and PCIe can be developed for multiple applications, such as Network Attached Storage (NAS) or wireless router. Although PCIe will be disabled for NAS and SATA will be disabled for router, the time to market is shorter than developing two different SoC's.

With current technology, SoC's are relatively easy to develop if they have a relatively small numbers of cores or if the core interfaces are simple, all conform to the same set of standards and come from the same vendor (developer). Unfortunately, the market has driven SoC's to integrate large numbers of cores with complex interfaces that follow, to one extent or another, a number of different standards and come from a wide variety of vendors. Although, there are some tools to help SoC developers, the job of configuring the individual cores in such a way that they can optimally work together to create an SoC is largely manual. Configuring all the cores on an SoC for the best possible performance to accomplish the objective is called "orchestration".

Furthermore, the orchestration of a particular SoC is typically focused on a single application. Even if 90% of the cores could be used for another related application, that SoC has to be a separate semiconductor with separate orchestration. This raises the cost of both SoC's because it reduces the potential economy of scale. Optimal leveraging of economies of scale is what can make semiconductors so cost effective.

Another consideration is that the orchestration is required to manage optimization across multiple perspectives, such as performance, power, thermal, and so on. The existing development methods typically handle single perspective optimization per SoC. For example, an SoC for server application may be tuned for performance, and an SoC for consumer application may be tuned for longer battery life. However, these perspectives are no longer independent where complexity and scale converges.

FIG. 1 is a block diagram illustrating an embodiment of a wireless router system built using IP cores. In the example shown, an available set of IP cores 100 includes a Gigabit Ethernet core 102, a USB2/USB3 core 104, a video/graphics controller core 106, an application processor core 108, a SATA controller core 110, and a WiFi radio core 112. Through a design process 114 the cores 102, 104, 108, and 112 are selected, configured, and inter-connected to provide and implement an integrated circuit design 120 for a wireless router. The cores 106 and 110 are not used in the design, in this example because their functionality is not required to be included in the wireless router to be built using design 120. Typically, the design process 114 is labor intensive and time consuming. Mutually compatible cores having desired features and performance characteristics must be identified from a variety of sources, each potentially using a different way to describe its various IP cores. Once cores have been selected, their respective configurations must be determined based on their respective attributes, and an integrated design incorporating the selected and configured cores generated, for example by one or more human operators using design tools that partly automate the process.

FIG. 2 is a block diagram illustrating an embodiment of a system built using IP cores. In the example shown, the system 200 has been built by connecting the cores 102, 104, 106, 108, 110, and 112 of FIG. 1 via a high speed interconnect 202. Each of the cores 102, 104, 106, 110, and 112 has an associated range of supported and/or required data rates as indicated in FIG. 2. In a typical prior art design process, a human designer must consider the respective supported and/or required rates and must select a design rate and/or other configuration data for the respective IP cores. In addition, different applications that might be run on application processor core 108 may require and/or imply different peak data rates, such that the application(s) to be supported by the system may have to be taken into consideration in selecting the other cores, the required (or available) capacity of the interconnect 202, and the respective rates at which the IP cores will be configured to operate. The frequency at which the application processor and/or other cores will operate may also have to be determined and set.

BRIEF DESCRIPTION OF THE DRAWINGS

Various embodiments of the invention are disclosed in the following detailed description and the accompanying drawings.

Figure 10:
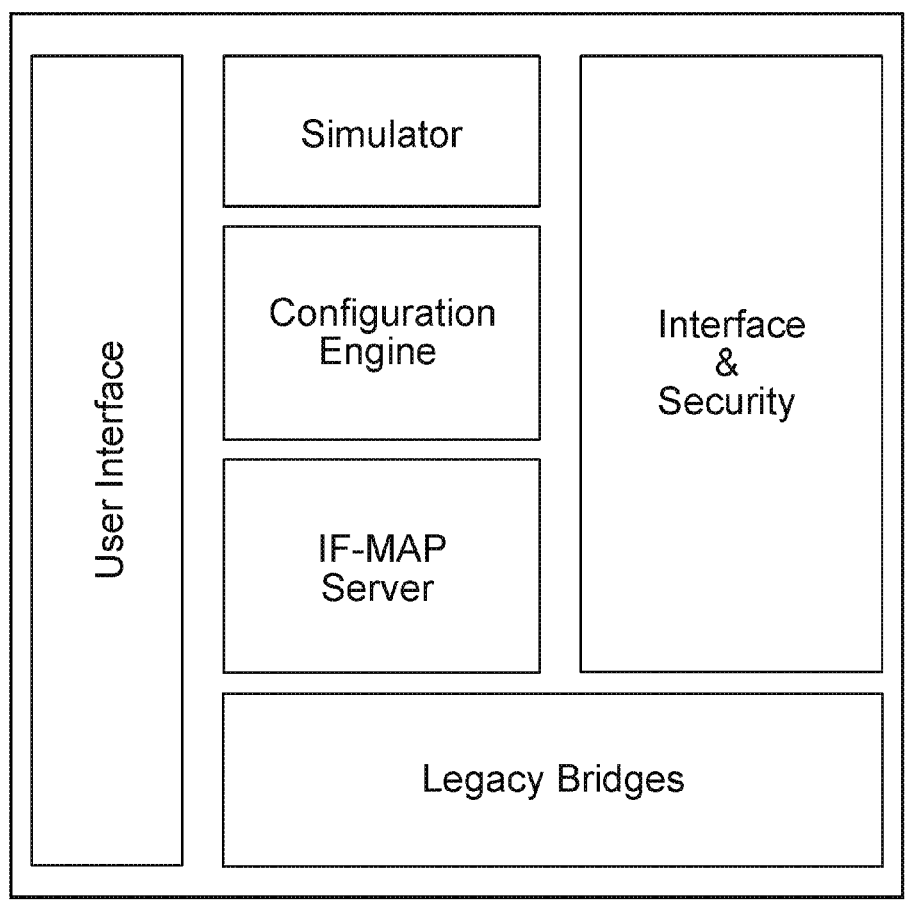

The internal structure of the Conductor in some embodiments is shown in FIG. 10.

Figure 11:
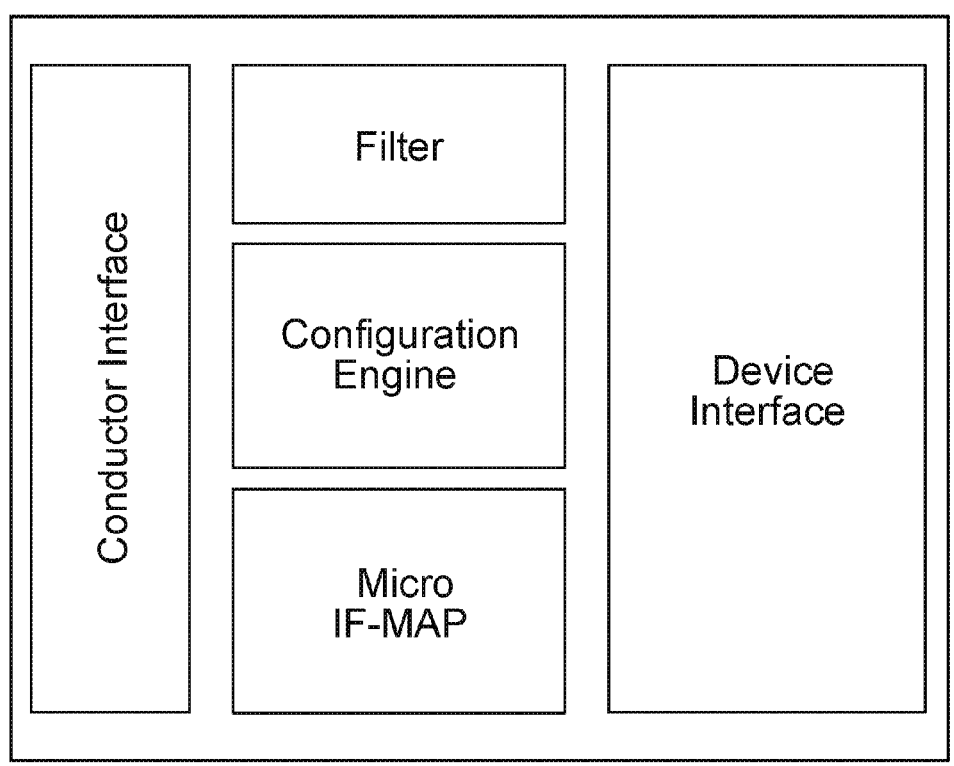

The internal structure of the Orchestrator is shown in FIG. 11

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques to automate the orchestration of a particular SoC in the design and development phase are disclosed. Not only for a single perspective, but also for multiple perspectives at the same time. The disclosed approach dramatically reduces Time to Market (TTM) and costs, and drastically increases the value of SoC's. In some embodiments, a given SoC re-orchestrates itself in the field so that it can support more than one application (that is, respond to a changing environment, which includes changing applications), thus taking advantage of economies of scale and further dramatically reducing costs. With the capability to re-orchestrate in the field, it becomes economically feasible to include a relatively small number of extras cores that could be turned on and turned off as needed as the specific application changes.

A semiconductor intellectual property core ("IP core") is a reusable building block that can be combined with one or more other units, such as other IP cores, to design and build an integrated circuit to perform a specific task or set of tasks, such as an SoC or other integrated circuits. An IP core may be licensed by a private owner or made available for free as an "open" IP core. IP cores may be obtained from their owner, via open source sites, or from third party aggregators and/or other vendors.

In various embodiments, all devices in an SoC are abstracted as cores. Each core has a set of objectives. These objectives can be considered to be similar to a job description and a management by objective set of objectives. Each core also has a set of rules. These rules are either limit functions or if—then statements. Each core has a set of algorithms. The algorithms are a set of tools available to the core to try to achieve its objectives given a set of conditions within the constraints of its rules. Finally, each core has an environment. The environment includes an overall application objective(s) for the SoC as a whole. Each core monitors its internal configuration and external environment parameters.

Figure 3A:
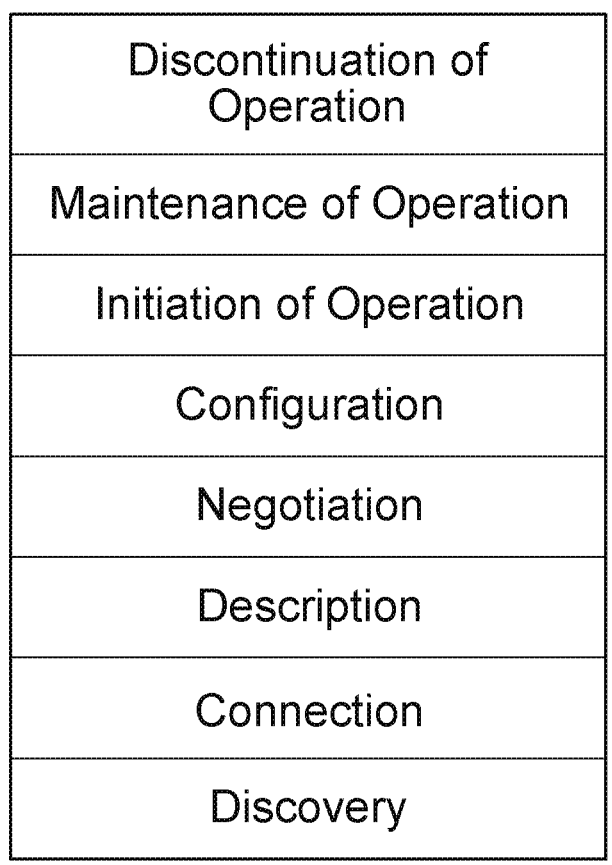
FIG. 3A is a block diagram illustrating an embodiment of a Process 300.

FIG. 3A is a block diagram illustrating an embodiment of a Process 300. To interact with the other cores in the network, each core uses the layered (it can also be considered a state machine representation) protocol (Process 300) illustrated in FIG. 3A. This protocol differs from the ISO OSI (International Standards Organization Open System Interconnect) Model in that all information in each layer is available to all other layers.

In various embodiments, the core uses the protocol as follows. It seeks to satisfy its objectives by discovering another node(s) which may help it do so. It performs the Discovery process by a combination of sensing relevant communication parameters and sending out messages identifying itself and its objectives. When it Discovers another core which may appear capable of helping, it establishes a Connection. The Connection is only for the purpose of Description, Negotiation, and Configuration. Once a Connection is established, the two cores exchange Descriptions. Based on the Description received from the other node, each core determines if the other core can help it achieve its objectives. If so, the two cores proceed to Negotiation. The first core bids a set of parameters that will help it achieve its objective. If the second core determines that a modified version of the parameters will better help it to achieve its objectives, it sends a counter bid. This proceeds to the point where both cores accept the same bid. This acceptance constitutes a bind (contract). Once a bind has occurred, each core Configures itself in accordance with the bind. Once Configuration is complete, Initiation can commence. Because Initiation may involve very time critical events, the Initiation procedure to be used can be part of the bind and prepared for in the Configuration stage. Once Initiation has taken place, both cores continue to monitor the environment. If there are changes that make the current Initiation sub optimal, while continuing to operate in the Initiation in place, the two cores start a new negotiation which may result in a new Configuration and a new Initiation or a Discontinuation of Operation.

The Process is implemented in various embodiments by an agent that receives its objectives, rules, algorithms, and environmental information. The agent in some embodiments is implemented in software; in others in hardware and in some others in a combination of hardware and software.

The above can be embodied three ways. It can be:
Fully centralized
Fully distributed
Hybrid distributed for local optimization and centralized for global optimization In the fully centralized embodiment all agents for all cores are located in a device called a Conductor. Inside the Conductor are a series of agents. Each agent has all the information pertaining to a single core and acts for that core in the interactions of the Process. The Conductor converts the results of the interaction into instructions it sends to the cores to configure themselves. The Conductor also contains a Simulator. The simulator allows what-if questions to be asked and answered to evaluate different possible courses of action. The internal structure of the Conductor in some embodiments is shown in FIG. 10. In some embodiments the Conductor is only off-chip. In that embodiment, the Conductor acts as a design tool. In other embodiments, the Conductor is itself an on-chip core that manages configuration of the chip in operation. In this embodiment, cores send status information during operation to the Conductor which is entered into the corresponding core image and part of the environmental information the Conductor receives is information about the nature of the application it is to support. This allows the SoC to modify its operation as the application changes.

In the fully distributed embodiment, the agent called an Orchestrator is in each core. It interacts with its neighbors (both physical and logical neighbors) according to the Process. The internal structure of the Orchestrator is shown in FIG. 11. This allows the SoC to modify its operation as the application changes. In this embodiment, the Conductor may be used in the design and development process.

In the hybrid embodiment, local optimization is performed as per the fully distributed embodiment. A portion of the information contained in the local image contained in the Orchestrator is sent to an on-chip Conductor. The selection of the information sent to the Conductor is determined by the Filter. The reason for filtering is to reduce the amount of capacity consumed by the overhead of sending updates to the Conductor. The Conductor monitors global environment information not easily made available to the Orchestrators and combines that global information with the core images to develop instructions sent to the Orchestrators. These instructions can take the form of new rules, new objectives, or new algorithms. They may also involve creating new types of parameters in selected cores. The Hybrid Conductor can be either on-chip or off-chip. In this embodiment, cores send status information during operation to the Conductor which is entered into the corresponding core image and part of the environmental information the Conductor receives is information about the nature of the application it is to support. This allows the SoC to modify its operation as the application changes. A Conductor can also be used in the design and development phase.

Because there are more than one standard about representation of core metadata; not all vendors use or fully comply with these standards; and the standards do not anticipate the full functionality of this invention, the Conductor contains a Legacy Bridges internal component. This component will contain a set of translation facilities to interface with existing cores using their existing protocols and interfaces. Since these existing protocols and interfaces didn't foresee the development of these embodiments, the information available may not include all the parameters that would produce the most optimal orchestration.

There are several ways that metadata, objectives, rules and algorithms can be handled by the Conductor and the Orchestrator. In off-chip Conductors that function in the design and development stage, there may be sufficient time to allow for database definition, organization and maintenances. In implementations on-chip in application environments that have a lot of volatility, an IF-MAP like linked list type data store may be the only practical way of making the system work. In some embodiments, an off-chip Conductor may also be operated in the equipment in which the SoC is contained and function in a fashion similar to an on-chip Conductor.

In addition to providing an ability to handle multiple applications and changing application environments, on-chip embodiments can allow SoC's to continue to function when all or a portion of a core fails. This can be achieved either by having extra cores on the die and switching out the core affected by the area of the die that has failed, or by reconfiguring the unaffected cores to compensate for or operate with the affected core in its damaged state. Thus, failure is one of the ways that the Environment can change. Discovery, Connection, Description, Negotiation, etc. will be initiated as soon as the Conductor detects this or other types of Environment change. This is particularly valuable in long lived applications in harsh environments such as automotive. An off-chip Conductor may also be operated in the equipment that the SoC is attached to and function in a fashion similar to an on-chip Conductor.

Automated techniques to design, dynamically reconfigure cores, and/or operate integrated circuits are disclosed. In some embodiments, an automated process that includes stages of auto-discovery, meta-language based self-description, negotiation, configuration, and design is used to provide an integrated circuit design using one or more IP cores. In some embodiments, a centralized "Conductor" component uses image data describing various IP cores to identify cores to be included in a design and to determine and implement an optimal set of configurations for the respective cores. In some embodiments, an on-chip conductor is included in the design. The on-chip conductor in various embodiments maintains a globally optimal set of configurations as conditions change, for example, as the integrated circuit is required to reconfigure itself to perform a different function, or to perform the same function in different conditions and/or in a different manner (e.g., higher clock frequency to reduce latency, higher or lower data rate, etc.). In some embodiments, one or more of the cores includes a core-specific "orchestrator" component configured to participate on behalf of the core in processes to discover other cores, provide self-description of the core, receive and interpret descriptions from other cores, negotiate configuration settings with other cores, and/or maintain a locally optimal configuration while meeting negotiated commitments to other cores and/or the system as a whole.

Figure 3B:
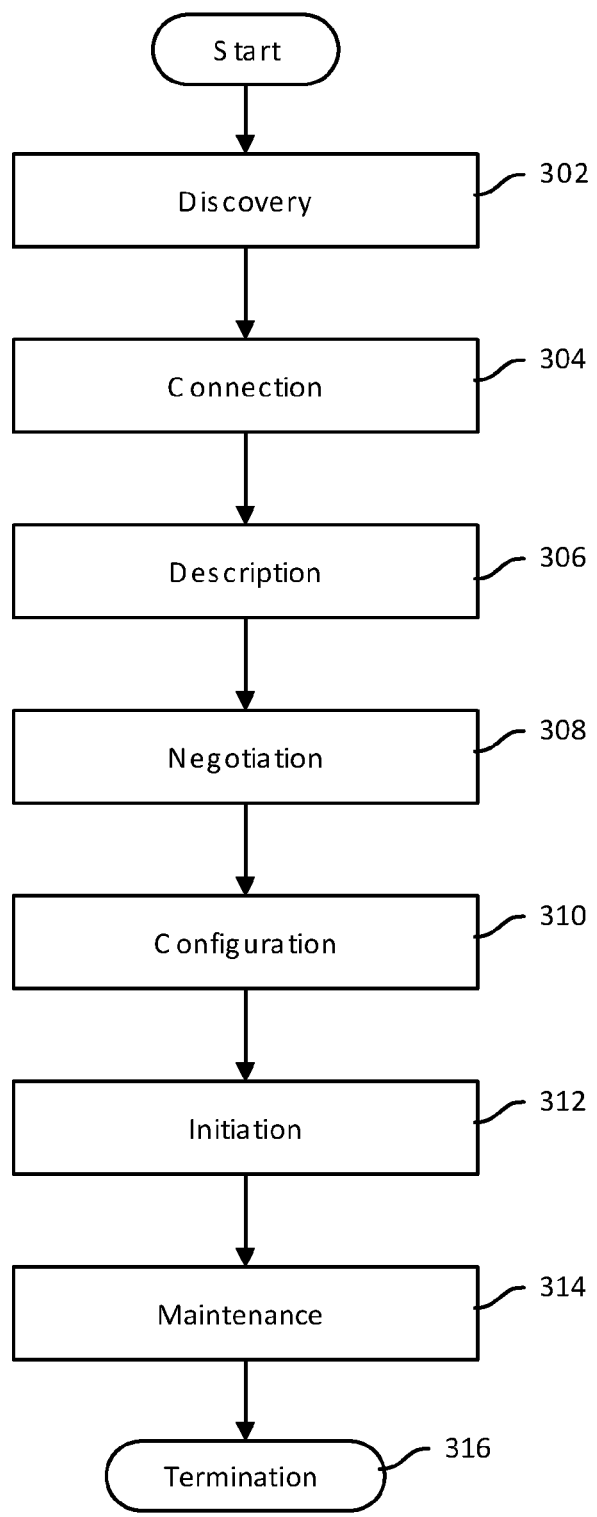
FIG. 3B is a flow chart illustrating an embodiment of a process to design and/or operate an integrated circuit.

FIG. 3B is a flow chart illustrating an embodiment of a process to design and/or operate an integrated circuit. In the example shown, the process begins with a stage of discovery (302) in which one or more IP cores (or other building blocks) potentially suitable to be included in the design are discovered. In some embodiment, discovery may include searching one or more data stores in which information regarding one or more available IP cores is stored. Optionally a connection (304) is established with and/or between one or more IP cores. In some embodiments, connection may include connecting to one or more data stores as described above. In a description stage (306) a meta-language based description of each of one or more IP cores is accessed and/or exchanged. In some embodiments, descriptions available from IP core owners, open source listings, aggregators, and/or other vendors or providers of IP cores and/or information about available IP cores are retrieved, for example by automated or partly automated crawling of associated web sites or other data sources, are gathered and stored. Descriptions already expressed in a common (for example, standards based) meta-language are stored as received, those expressed other than in the common meta-language are transformed to generate and store a description in the meta-language. In some embodiments, transformation is performed by a bridge or other element (see FIG. 10, Legacy Bridges). In various embodiments, an IP core's description may include one or more of the following: one or more objectives of the IP core (e.g., in the case of a Gigabit Ethernet core, an objective may be to perform full duplex packet routing at 1 Gbps; one or more rules applicable to the core (e.g., in the case of a Gigabit Ethernet core, examples of rules include that each packet may/must have one descriptor, descriptor size is 32 or 64 bytes, packet size is 64-1500 bytes, operational clock frequency at 250-350 MHz, etc.; or for an application processor, rules may include data transfer size (i.e., cache line size) is 32 bytes fixed, operational clock frequency at 400-800 MHz, etc.); algorithms and/or protocols supported and/or required to be used by/with the core; peak bandwidth requirements; minimum bandwidth required; maximum latency tolerable (or range of latency); etc.

In a process of negotiation (308), an optimal (or at least mutually compatible and/or achievable) set of configurations for the respective cores is determined. In some embodiments, a central "Conductor" or other core determines a globally optimal combination of configurations for the cores, based at least in part on their respective descriptions. For example, a set of configurations (i.e., values for configurable parameters) that enables an operational requirement of the system to be satisfied within the limits defined by the rules applicable to the respective cores is determined. In an embodiment in which a central conductor alone determines the configurations the process of "Negotiation" may be considered one of "optimization" in which the central conductor applies one or more optimization algorithms to determine the optimal (or at least acceptable) set of configurations. In some embodiments, the process of negotiation may involve an exchange of bids between two or more nodes, such as two or more cores and/or agents acting on behalf of such cores, mutual evaluation of received bids, and potentially one or more rounds of counter bids, until a mutual understanding is reached as to which configurations (values for configurable parameters) will be used, resulting in a binding "contract" between the negotiating nodes.

Once the configurations have been negotiated, the respective cores are configured (310) as required to fulfill the negotiated "contract". Examples include selecting and/or otherwise setting values for configurable parameters such as data rates and/or transfer size, packet or descriptor size, clock frequency, bandwidth, buffer sizes, etc. Once configurable parameters have been set, the respective IP cores are used to generate an implementable integrated circuit design through a process that may include stages of initiation (312), maintenance (314), and termination (316), resulting in an implementable (i.e., ready to produce in silicon) integrated circuit design based on the selected IP cores configured as described above.

Figure 4:
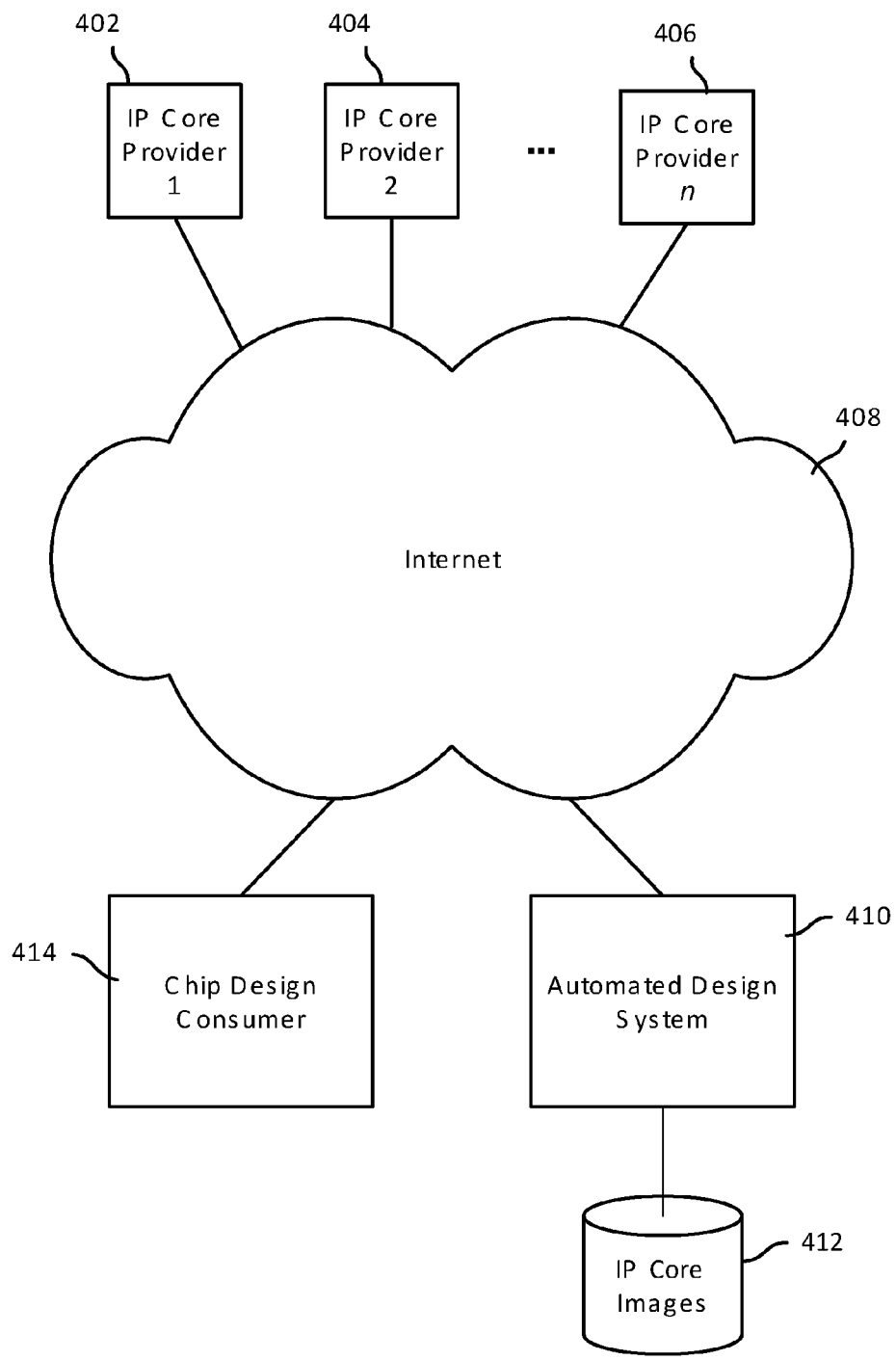
FIG. 4 is a block diagram illustrating an embodiment of an integrated circuit design system.

FIG. 4 is a block diagram illustrating an embodiment of an integrated circuit design system. In the example shown, a plurality of IP core providers represented by providers 402, 404, and 406 make IP cores and/or IP core descriptions available to be accessed via the Internet 408. An integrated circuit design system 410 accesses IP core descriptions via the Internet 408 and for each core stores IP core image data in an IP core image data store 412. In various embodiments, the IP core image data includes for each IP core a meta-language based description of the IP core, for example, its objective(s), rule(s), etc. One or more operational requirements are defined by a chip design consumer 414, for example via an IC requirement definition interface or tool, and used by IC design system 410 to discover, select, determine an optimal configuration for, and configure IP cores to be used to provide an IC that satisfies the operational requirements, and to use the configured IP cores to provide an IC design usable to produce chips that meet the defined operational requirements.

Figure 5:
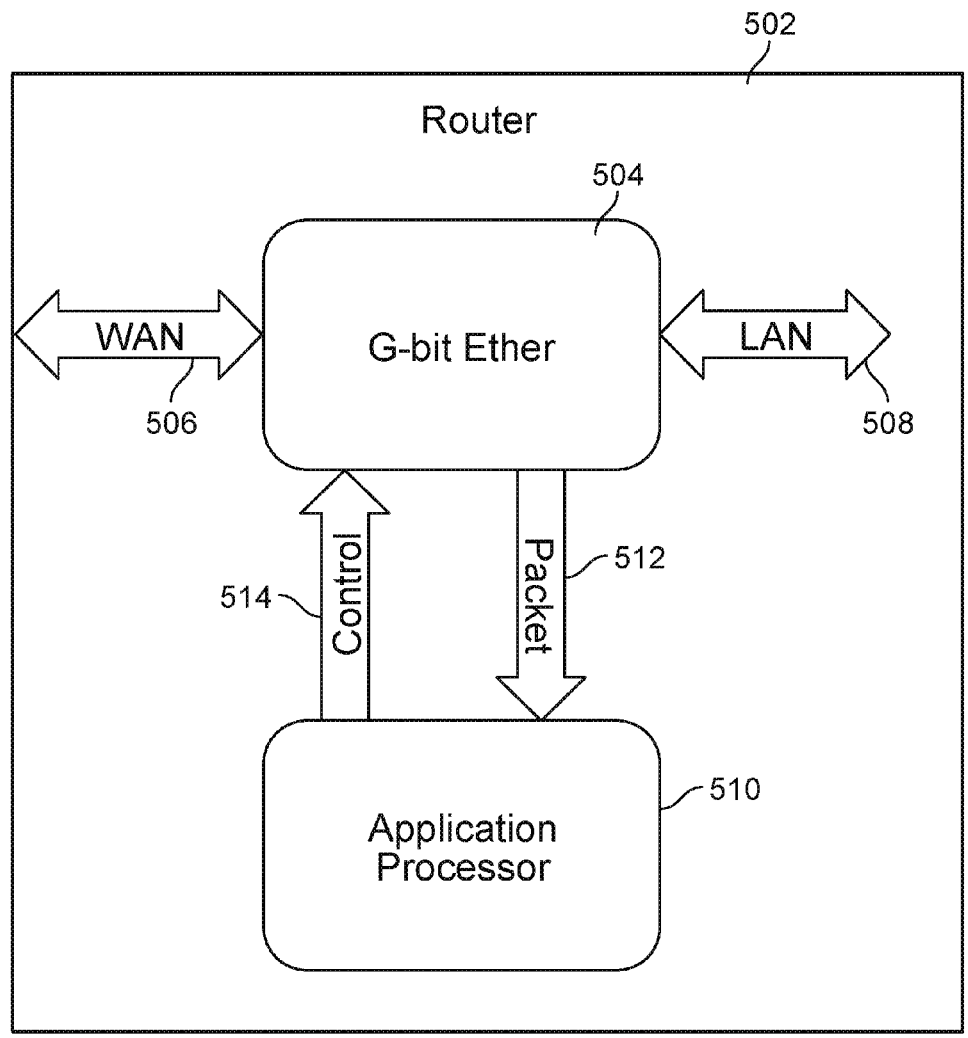
FIG. 5 is a block diagram illustrating an embodiment of a router system built using IP cores.

FIG. 5 is a block diagram illustrating an embodiment of a router system built using IP cores. In the example shown, the router 502 includes a gigabit Ethernet core 504 configured to route traffic between a local area network 508 and a wide area network 506. Router 502 also includes an application processor core 510 configured to perform routing functions, such as translating addresses as required to route packets between the LAN and WAN domains. Packet data (e.g., descriptors) 512 is received and control data 514 indicating how each packet is to be routed, e.g., translated destination addresses, are provided as output to the Gigabit Ethernet core 504. To design the router 502, in various embodiments a central conductor may access a data store comprising IP core images to identify optimal and mutually compatible Gigabit Ethernet and application processor cores. IP core image data may be used to determine optimal transfer sizes (bus width) and/or transfer speeds (bus clock) to achieve the respective objectives within the respectively applicable constraints (rules) of the IP cores. Examples of parameters to be configured within constraints include without limitation for the Ethernet core the overall total interval at which packets are generated (e.g., 64 byte packet every 168 clock cycles) as compared to data transfers by/between the cores that must occur within the configured interval along with processing that must be performed by the application processor core within the same interval. Cost, size, and other constraints may be considered in the optimization process.

Figure 1:
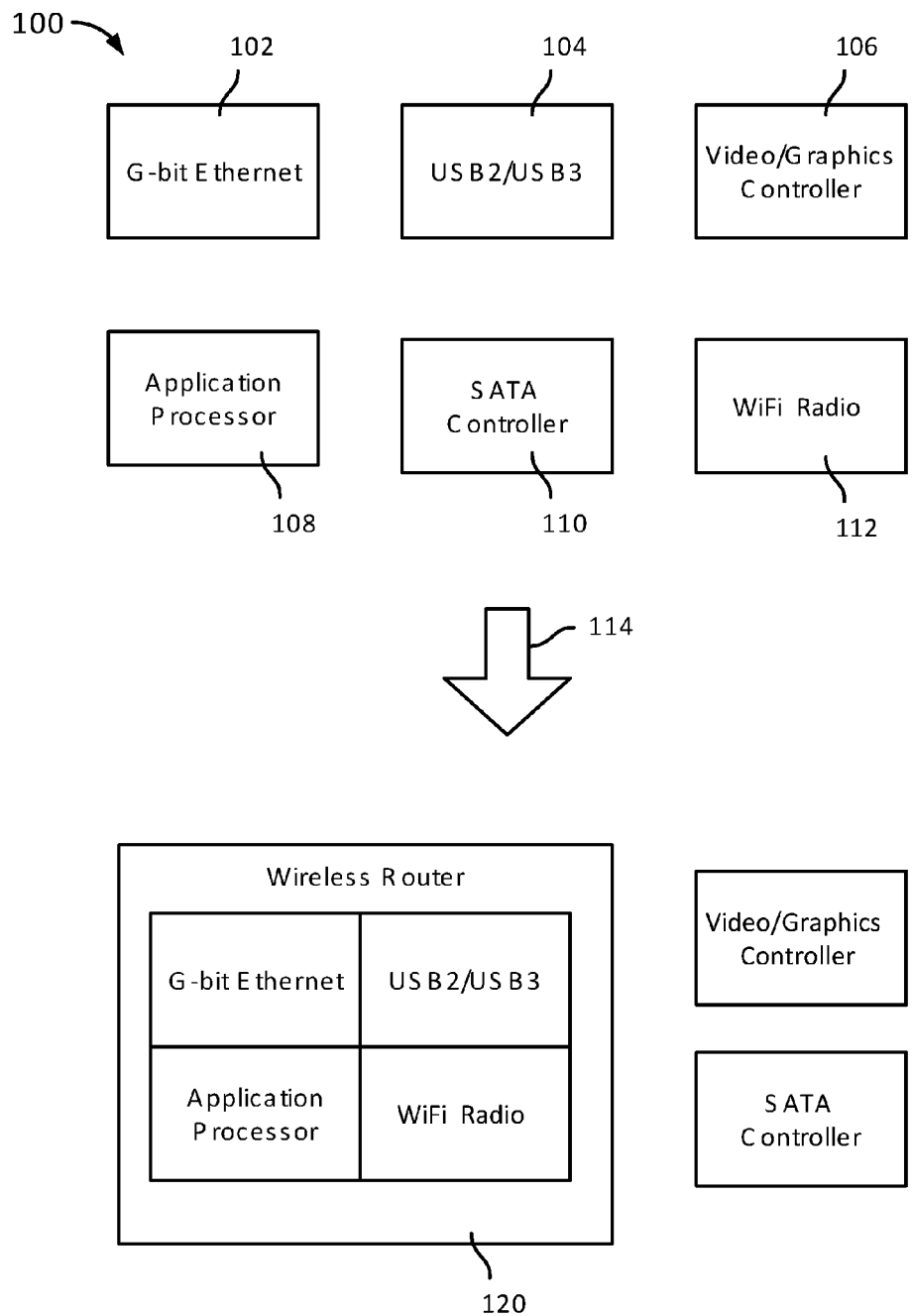
FIG. 1 is a block diagram illustrating an embodiment of a wireless router system built using IP cores.
Figure 2:
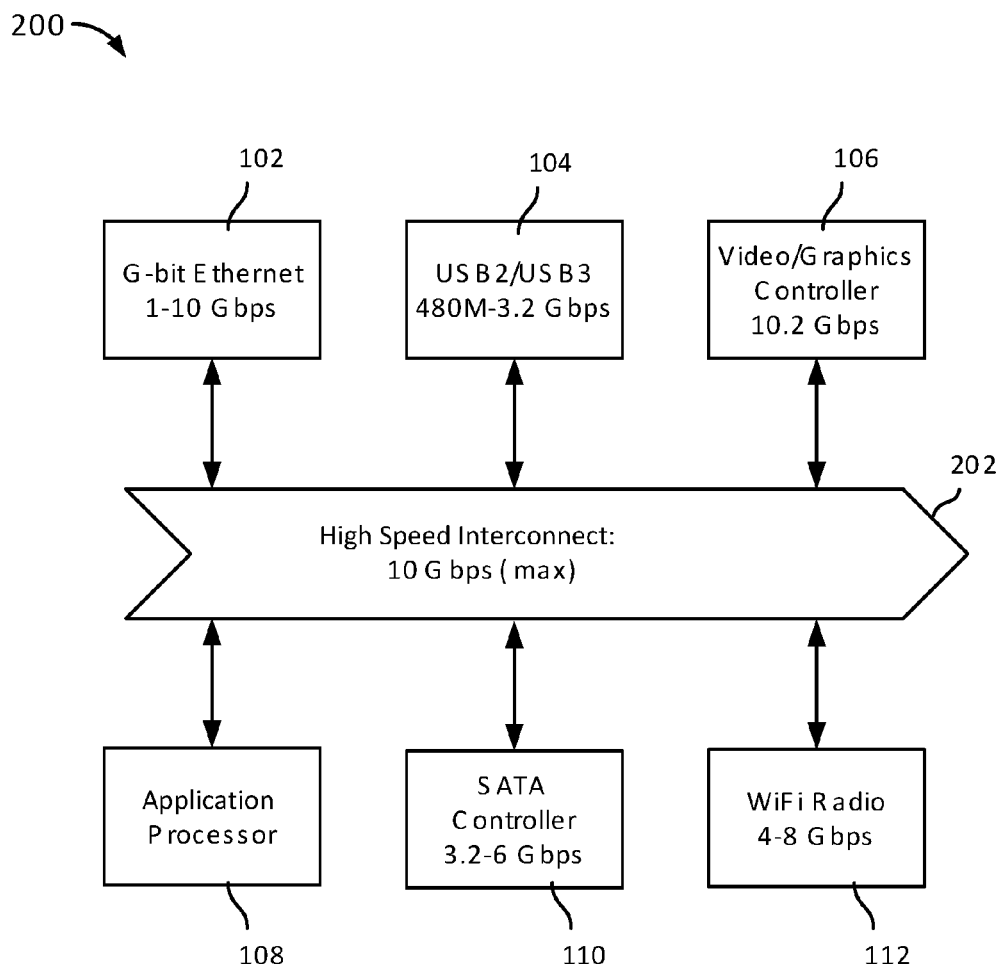
FIG. 2 is a block diagram illustrating an embodiment of a system built using IP cores.

In another example not shown in FIG. 5, bandwidth on a high speed interconnect (such as interconnect 202 of FIG. 2) may be limited, for example based on the amount of DRAM provided. If an amount of DRAM that provided 6.4 Gbps of bandwidth were proposed and/or required for a bus provided to support communication among a Gigabit Ethernet core, a SATA controller core, and an application processor core, and if the Ethernet core was contemplated and/or proposed (bid) to use 2 Gbps and the SATA core 3 Gbps, then the application processor would be able to support an application or combination of applications requiring only 1.4 Gbps or less bandwidth on the bus. To support applications requiring greater bandwidth, the configuration of the other cores would have to be changed to require less bandwidth and/or the amount of DRAM increased to provide more bandwidth. In various embodiments, an iterative and/or other process would be used to determine an optimal set of configurations for the respective cores, and an optimal bandwidth for the bus, within applicable constraints identified, for example, in the IP core image data and/or by the IC design consumer.

Figure 6:
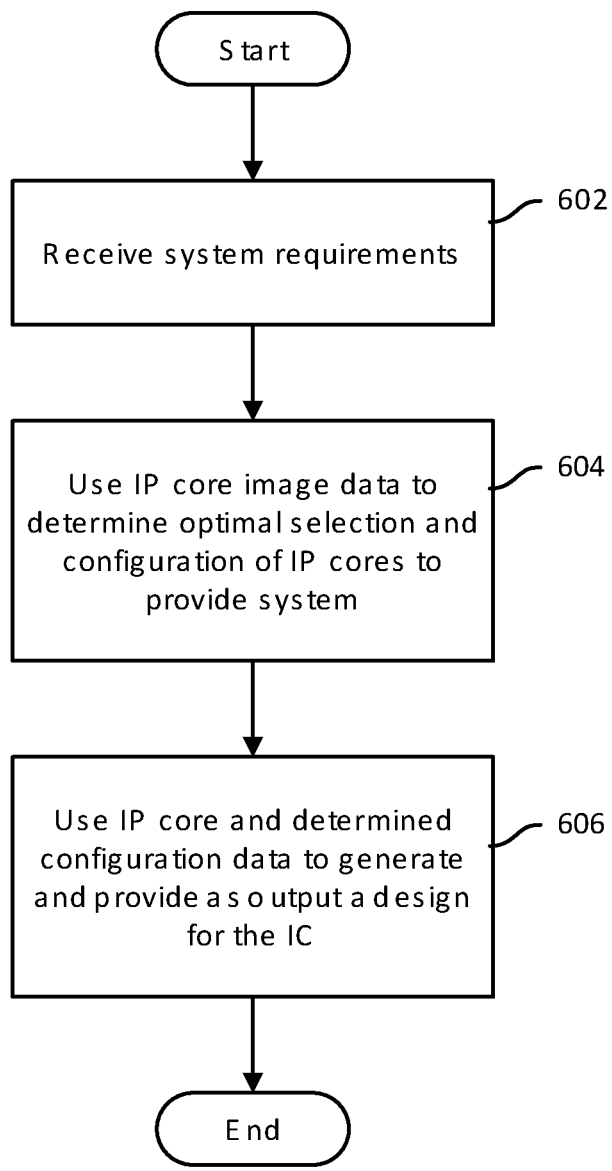
FIG. 6 is a flow diagram illustrating an embodiment of a process to design an integrated circuit.

FIG. 6 is a flow diagram illustrating an embodiment of a process to design an integrated circuit. In the example shown, system requirements are received (602). IP core image data is used to select an optimal combination of IP cores to be combined to achieve the operational requirements, and to configure the IP cores optimally to achieve the requirements (604). In various embodiments, IP cores are selected and/or configured through processes of discovery, connection, description, negotiation, and/or configuration, as described herein. The selected and configured IP cores are used to generate and provide as output a design for the required integrated circuit (606). In various embodiments, the design is generated at least in part through processes of initiation, maintenance, and termination as described herein.

Figure 7:
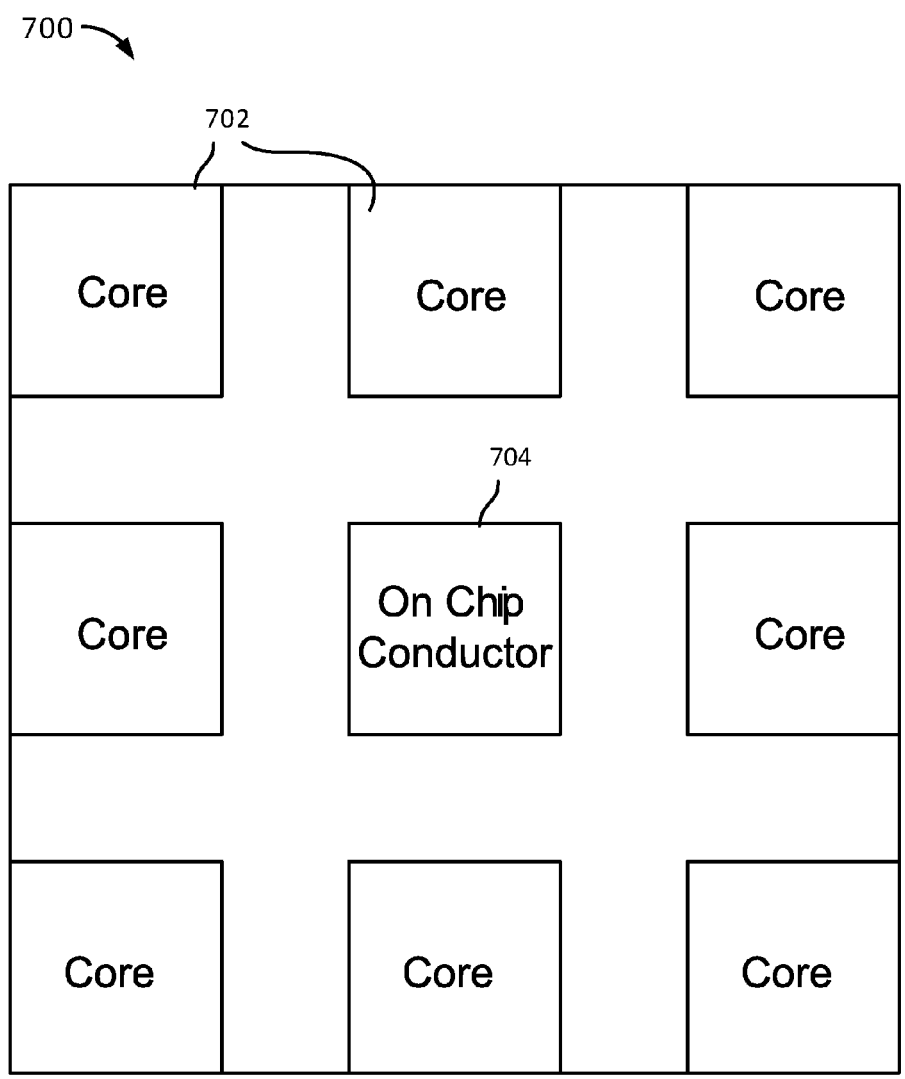
FIG. 7 is a block diagram illustrating an embodiment of an integrated circuit that includes an on-chip conductor.

FIG. 7 is a block diagram illustrating an embodiment of an integrated circuit that includes an on-chip conductor. In the example shown, the integrated circuit 700 includes a plurality of IP cores 702 in communication with each other, for example via a high speed interconnect not shown in FIG. 7, and an on-chip conductor 704. In various embodiments, the on-chip conductor 704 uses core image data stored in an on-chip IP core image data store (not shown) to configure and/or reconfigure the IP cores 702 and/or a selected subset of them to perform required operations of the IC 700 as conditions change over time. In some embodiments, the on-chip conductor 704 provides a programmable and/or dynamically reprogrammable "system on a chip", for example by configuring a selected subset of IP cores 702 to cooperate to provide a currently demanded system. For example, Gigabit Ethernet, USB2/USB3, WiFi radio, and application processor cores included in the cores 702 may be configured to provide a wireless router. If in addition and/or instead network attached storage (NAS) were required, Gigabit Ethernet, USB2/USB3, SATA controller, and application processor cores may be configured to provide network attached storage functionality. Likewise, to provide a set top box system on a chip, Gigabit Ethernet, video/graphics controller, SATA controller, and application processor cores may be configured and combined. In this way, different combinations of IP cores can be used to provide dynamically selectable systems on a chip. In some embodiments, within a configured and running combination of IP cores, one or more IP core and/or other system parameters may be changed dynamically by the on-chip controller, for example to adjust to load or other conditions, conserve power, recomputed optimal configurations based on long term observation of operating conditions and/or system performance, etc.

Figure 8:
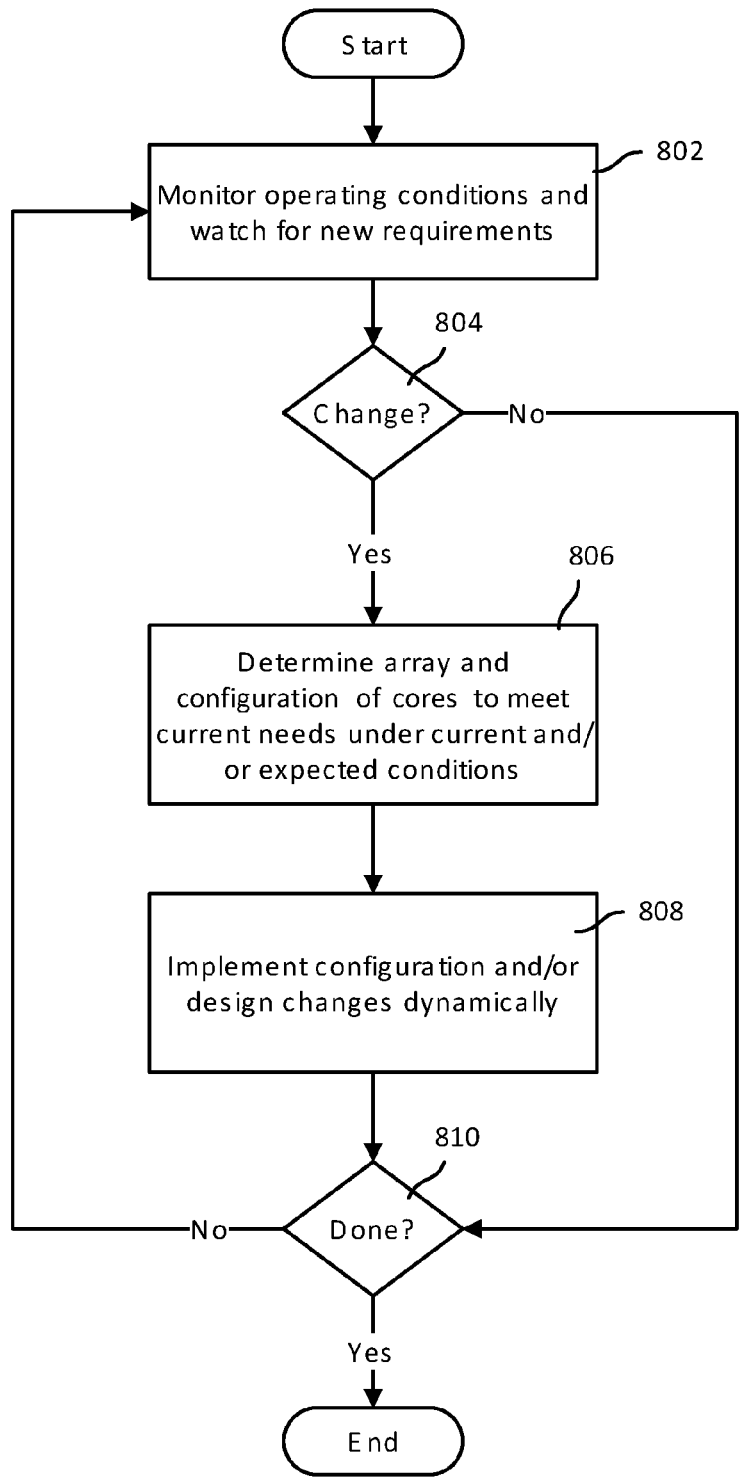
FIG. 8 is a flow diagram illustrating an embodiment of a process to change IC configuration dynamically.

FIG. 8 is a flow diagram illustrating an embodiment of a process to change IC configuration dynamically. In various embodiments, the process of FIG. 8 is implemented by an on-chip conductor such as conductor 704 of FIG. 7. In the example shown, the on-chip conductor monitors operating conditions and/or requirements (802). If a change in the arrangement and/or configuration of cores is determined to be required (804), the on-chip conductor determines the selection and configuration of IP cores required to meet current needs under current and/or anticipated conditions (806) and implements configuration and/or design changes dynamically to meet the changing conditions and/or requirements (808). Monitoring and/or dynamic adjustment continue until done (810), for example the system is powered down.

Figure 9:
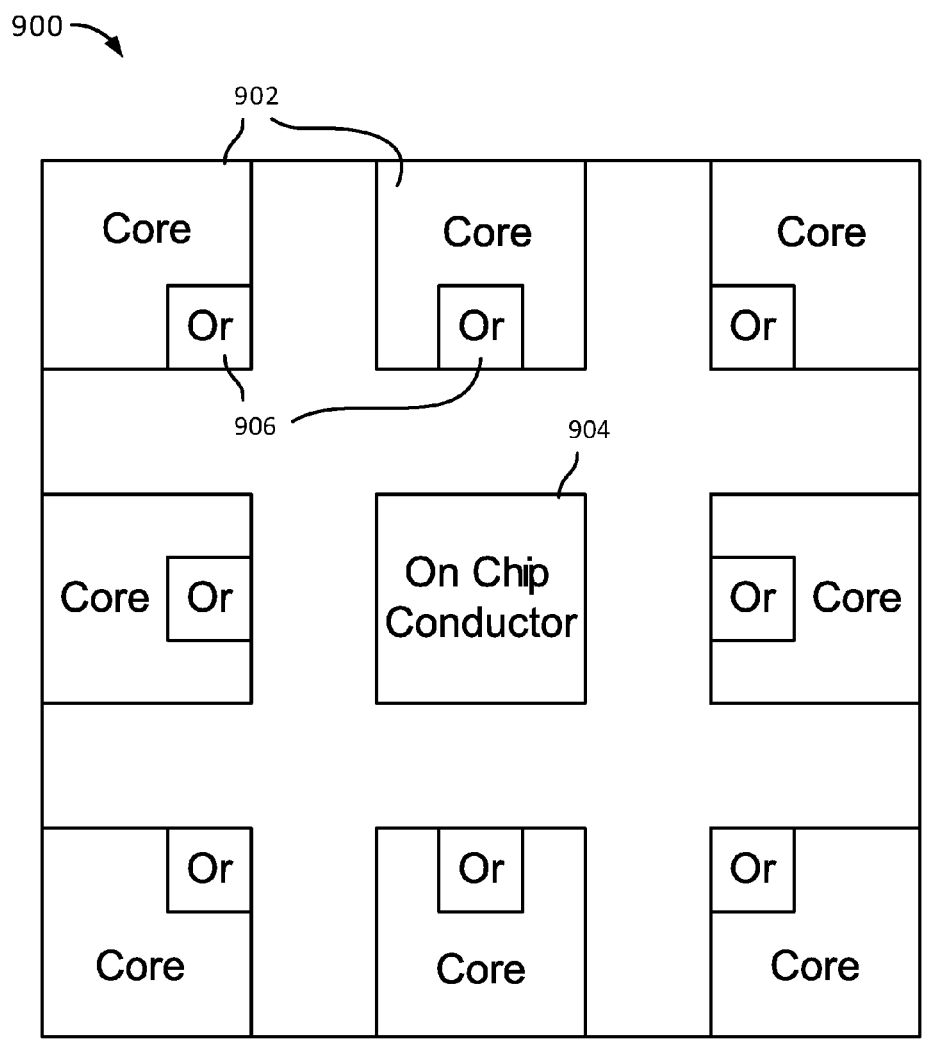
FIG. 9 is a block diagram illustrating an embodiment of an integrated circuit. In the example shown, the integrated circuit 900 includes a plurality of IP cores 902 and an on-chip conductor 904.

FIG. 9 is a block diagram illustrating an embodiment of an integrated circuit. In the example shown, the integrated circuit 900 includes a plurality of IP cores 902 and an on-chip conductor 904. Each of the IP cores 902 includes an "orchestrator" 906. In various embodiments, the orchestrator 906 is configured to communicate on behalf of the core with one or more other cores 902 and/or conductor 904 as required to cause the respective cores and/or a suitable subset of them to be configured and/or configure themselves to perform a required function, for example to provide a required system on a chip. In various embodiments, the orchestrators are configured to discover, connect to, and/or negotiate with other cores to determine a mutually agreed set of configuration parameters to enable the cores to configure themselves and/or be configured to cooperate to provide a required system and/or functionality. In various embodiments, on-chip conductor 904 participates to attempt to achieve a global optimization across IP cores while each respective IP core's orchestrator 906 negotiates on behalf of the IP core 902 with which it is associated to achieve local optimization at the IP core within the confines of the global optimization and other constraints. In various embodiments, the respective orchestrators may be configured to provide opening "bids" that propose parameter values (e.g., data transfer size and/or rate) that are optimal for that core. If differences in bids cannot be bridged through direct communication between cores, the on-chip conductor 904 intervenes to resolve differences in a way that achieves a more globally optimal solution within applicable constraints. In various embodiments, orchestrators 906 may be configured to participate in dynamic reconfiguration of a dynamically reprogrammable system on a chip, for example as described above, and/or to negotiate and/or implement local configuration changes as may be required to continue to operate within applicable constraints and/or in a locally optimal manner in light of changed and/or dynamically changing operating conditions.

Using techniques described herein, more fully automated IC design using IP cores and/or field programmable and/or dynamically reprogrammable and/or reconfigurable systems on a chip may be provided, greatly increasing flexibility and reducing the time and cost to provide IC designs.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a data store configured to store core image data comprising a meta-language based description of each of a plurality of cores; and
   a first agent associated with a first core, wherein the first agent comprises a processor configured to:
   receive an indication of an application-related objective, wherein the application-related objective is associated with an integrated circuit operational requirement received via an integrated circuit design requirement interface;
   use the meta-language based descriptions comprising the core image data stored in the data store to identify a second core from the plurality of cores to help the first core to achieve the application-related objective, including by determining, based at least in part on a meta-language based description of the second core, that the second core is able to help achieve the application-related objective;
   determine, at least in part by exchanging with a second agent associated with the second core one or more programmatically determined bids and responses to bids, a mutually compatible set of configurations for the first core and the second core to cooperate with each other to help achieve the application-related objective, wherein the one or more programmatically determined bids includes a set of parameters to help the first core achieve the application-related objective and the responses to bids includes a modified version of the set of parameters to help the second core achieve the application-related objective, the mutually compatible set of configurations comprising parameters agreed upon by the first core and the second core; and configure the first core and the second core based at least in part on the mutually compatible set of configurations.

2. The system of claim 1, wherein the data store has the capability to create and support an organically changing schema, and provides a mechanism to propagate changes to the schema or data as necessary.

3. The system of claim 1, wherein the processor comprising the first agent is further configured to establish connection with the second agent associated with the second core after identifying the second core in order to: (1) exchange meta-language based descriptions with the second core and (2) to negotiate with the second agent associated with the second core to determine a mutually compatible set of configurations.

4. The system of claim 1, wherein the processor comprising the first agent is further configured to receive an indication of a change in the application-related objective and to reconfigure, in response to the indication of the change, the first core to help achieve the changed objective.

5. The system of claim 1, wherein the first agent and the second agent each comprises an off-chip conductor element.

6. The system of claim 1, wherein the first agent and the second agent each comprises an on-chip conductor element.

7. The system of claim 1, wherein the first agent and the second agent each comprises an on core orchestrator embedded in or otherwise comprising, respectively, the first core and the second core.

8. A method, comprising:
receiving at a first agent associated with a first core an indication of an application-related objective, wherein the first agent is provided using a processor and the application-related objective is associated with an integrated circuit operational requirement received via an integrated circuit design requirement interface;
using one or more meta-language based descriptions comprising core image data stored in a data store to identify a second core from the plurality of cores to help the first core to achieve the application-related objective, including by determining, based at least in part on a meta-language based description of the second core, that the second core is able to help achieve the application-related objective;
determining, at least in part by exchanging with a second agent associated with the second core one or more programmatically determined bids and responses to bids, a mutually compatible set of configurations for the first core and the second core to cooperate with each other to help achieve the application-related objective, wherein the one or more programmatically determined bids includes a set of parameters to help the first core achieve the application-related objective and the responses to bids includes a modified version of the set of parameters to help the second core achieve the application-related objective, the mutually compatible set of configurations comprising parameters agreed upon by the first core and the second core; and
configuring the first core and the second core based at least in part on the mutually compatible set of configurations.

9. The method of claim 8, wherein the data store has the capability to create and support an organically changing schema, and provides a mechanism to propagate changes to the schema or data as necessary.

10. The method of claim 8, wherein further comprising establishing a connection with the second agent associated with the second core after identifying the second core in order to: (1) exchange meta-language based descriptions with the second core and (2) to negotiate with the second agent associated with the second core to determine a mutually compatible set of configurations.

11. The method of claim 8, further comprising receiving an indication of a change in the application-related objective and to reconfigure, in response to the indication of the change, the first core to help achieve the changed objective.

12. The method of claim 8, wherein the first agent and the second agent each comprises an off-chip conductor element.

13. The method of claim 8, wherein the first agent and the second agent each comprises an on-chip conductor element.

14. The method of claim 8, wherein the first agent and the second agent each comprises an on core orchestrator embedded in or otherwise comprising, respectively, the first core and the second core.

15. An integrated circuit, comprising:
a plurality of cores that includes a first core and a second core; and
a first agent associated with the first core, wherein the first agent comprises an orchestrator portion of the first core configured to:
receive an indication of an application-related objective, wherein the application-related objective is associated with an integrated circuit operational requirement received via an integrated circuit design requirement interface;
use meta-language based descriptions comprising core image data stored in a data store to identify the second core to help the first core to achieve the application-related objective, wherein the data store is configured to store the core image data comprising a meta-language based description of each of a plurality of cores;
exchange meta-language based descriptions with the second core, including by determining, based at least in part on a meta-language based description of the second core, that the second core is able to help achieve the application-related objective;
determine, at least in part by exchanging with the second core one or more programmatically determined bids and responds to bids, a mutually compatible set of configurations for the first core and the second core to cooperate to achieve the application-related objective, wherein the one or more programmatically determined bids includes a set of parameters to help the first core achieve the application-related objective and the responses to bids includes a modified version of the set of parameters to help the second core achieve the application-related objective, the mutually compatible set of configurations comprising parameters agreed upon by the first core and the second core; and
configure the first core based at least in part on the mutually compatible set of configurations.

16. The integrated circuit of claim 15, further comprising an on-chip conductor.

17. The integrated circuit of claim 16, wherein the on-chip conductor is configured to maintain a globally optimal set of configurations as conditions change.

18. The integrated circuit of claim 16, wherein the on-chip conductor is configured to use core image data stored in an on-chip IP core image data store to configure one or more cores comprising the integrated circuit.

19. The integrated circuit of claim 16, wherein the on-chip conductor is configured to resolve conflicts among one or more cores comprising the integrated circuits.

20. The integrated circuit of claim 16, further comprising a filter configured to filter information provided to the on-chip conductor by one or more cores comprising the integrated circuit.

* * * * *